(12) United States Patent
Muller

(10) Patent No.: US 7,099,074 B2
(45) Date of Patent: Aug. 29, 2006

(54) SIDE-PUMPING LASER AND OPTICAL FIBER SYSTEM

(75) Inventor: Heinrich G. Muller, Rancho Palos Verdes, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 10/999,885

(22) Filed: Nov. 30, 2004

(65) Prior Publication Data

US 2006/0126166 A1 Jun. 15, 2006

(51) Int. Cl.
*H01S 3/091* (2006.01)
(52) U.S. Cl. .................... 359/341.3; 372/38.06
(58) Field of Classification Search ........... 359/341.3, 359/341.32; 385/39; 372/38.06
See application file for complete search history.

(56) References Cited

U.S. PATENT DOCUMENTS

| | | | |
|---|---|---|---|
| 6,407,852 B1 * | 6/2002 | Lange et al. ............... | 359/333 |
| 6,603,905 B1 * | 8/2003 | Ionov ......................... | 385/39 |
| 6,731,837 B1 * | 5/2004 | Goldberg et al. ............ | 385/27 |

* cited by examiner

*Primary Examiner*—Mark Hellner
(74) *Attorney, Agent, or Firm*—Derrick Michael Reid

(57) ABSTRACT

An optical system couples laser light into an optical fiber, such as a optical amplifier fiber, from the side of the fiber by side-pumping of the fiber that is in contact with the laser such that refracted laser light is redirected into and through the fiber using direct attachment of a laser, such as a high-power laser diode, to the inner cladding of a fiber.

13 Claims, 2 Drawing Sheets

LATERALLY ATTACHED FIBER AND LASER SYSTEM

LATERALLY ATTACHED FIBER AND LASER SYSTEM

BACK ETCHED INTERFACE

SIDE-PUMPING LASER AND OPTICAL FIBER SYSTEM

FIELD OF THE INVENTION

The invention relates to the field of optical systems. More particularly, the present invention relates to lasers, optical fibers, and systems for coupling laser light into optical fibers.

BACKGROUND OF THE INVENTION

Lasers have been used to pump, that is, inject laser light into optical fibers, such as amplifier fibers. High power fiber lasers and amplifier fibers are being developed for remote sensing, target identification, high power directed energy applications, and long-distance free-space optical communications. Novel fiber designs involving double clad fibers with enlarged core sizes and mixtures of rare earth ions have facilitated optical systems with over 100 W of optical power. The pumping of such systems is a key step for reaching still higher output power levels. Most semiconductor lasers will emit light normal to the exit facet at the end of the laser waveguide. When the laser light from the facet is directed from any side into the fiber, the laser light will not be guided through the fiber but will exit the fiber after a single crossing of the fiber. Hence, a redirection of the laser light along the fiber is necessary. Current systems use various methods for redirecting and coupling the pumped laser light into optical fibers.

End pumping methods include end optical pumping using a dichroic mirror or using a concentric set of fibers that are fused and tapered together to connect several delivery fibers to the end of an amplifier fiber. End pumping is convenient to implement. However, end pumping becomes more difficult as the power level is increased due to crowding of the pumps, which need access to the end fiber facets. Additionally, there is limited control over the optical excitation profile along the length of the fiber amplifier because light can only be launched from two points, the front or the back whereas side-pumping allows for tailoring of the excitation profile as desired. End pumping is restricted to only laser pumping from the ends of the fiber.

Groove methods provide for cutting grooves into the glass, and launching light from the side of the fiber onto these grooves for reflecting the laser light into the inner cladding. Using grooves for side coupling severely debilitates the mechanical strength of the fiber. Forming reflecting grooves is a tedious and difficult process, particularly when the intrinsic performance of the fiber is to be unaffected by the grooves. Furthermore, under certain conditions, the grooves can couple a significant amount of light out of the fiber, when not designed and placed properly.

Directional side-pumping methods remove part of the secondary polymeric fiber cladding and provide pump light by a contacting pump fiber. Directional side-pumping methods are currently being used in commercial products. The directional side-pumping method is effective, but is not conducive for coupling high-power laser diode arrays. The directional side-pumping method is essentially limited to single element devices and undesirably requires that a long contact length be maintained between the pump fiber and the amplifier fiber. The directional side-pumping method disadvantageously requires intermediate fibers or optics, such as lenses, between the laser diode pump source and the pump fiber. These intermediate free space optics complicate system designs.

High power optical amplifiers and fiber lasers make use of amplifier fibers. An amplifier fiber includes a polymeric cladding, a hexagonal inner cladding for confining pump laser light, and an inner most signal light core that communicates the laser light to be amplified. For example, the Er or Er/Yb doped amplifier fibers are components for high bit rate optical networks. Reliable and high power laser diodes are the essential devices for pumping these amplifying fibers. These laser and fiber systems require high fiber coupling efficiency. High coupling efficiency usually requires that the lasers have high spatial beam quality. Broad area multimode lasers have inherently broad area beams. Tapered lasers provide a solution in terms of high brightness with high power and high spatial beam quality. High bit rate optical networks using these doped fiber amplifiers may use reliable high power laser diodes operating at 980 nm for pumping these fiber amplifiers. Current methods do rely on improved spatial beam quality of high power laser diodes for efficiently pumping the optical fiber. These and other restrictions are solved or reduced using the invention.

SUMMARY OF THE INVENTION

An object of the invention is to provide a system for side-pumping laser light into an optical fiber.

Another object of the invention is to provide a system for side-pumping laser light into an optical fiber through contact between the laser and the optical fiber.

Yet another object of the invention is to provide a system for side-pumping laser light into an optical amplifier fiber through contact between the laser and the optical amplifier fiber.

A further object of the invention is to provide a system for efficiently trapping pumped laser light in an optical fiber.

Still another object of the invention is to provide a system for side-pumping laser light into an optical amplifier fiber through contact between the laser and the optical amplifier fiber where indices of refraction direct the laser light in the optical amplifier fiber at an angle for confining the laser light within the optical amplifier fiber.

The invention is direction to a system for efficient laser pumping including a side-pumping contacting laser and an optical amplifier fiber using the differences in indices of refraction between the laser and the fiber. The system employs the use of optical refraction between the semiconductor material of the laser and the glass fiber to redirect the beam as desired within the fiber so that the laser light will not exit but be communicated along the length of the fiber. The correct amount of refraction occurs when the laser is directly attached to the fiber. The waveguide in the laser is angled such as 24° to the surface normal of the laser facet at the exit of the laser waveguide. As a system, the optical amplifier can be substantially simplified using these side-pumping lasers having direct contact and eliminating free space optical elements. Very high coupling efficiencies and robust operational products are enabled with low fabrication cost. These and other advantages will become more apparent from the following detailed description of the preferred embodiment.

DETAILED DESCRIPTION OF THE PREFERRED EMBODIMENT

Figure 1:
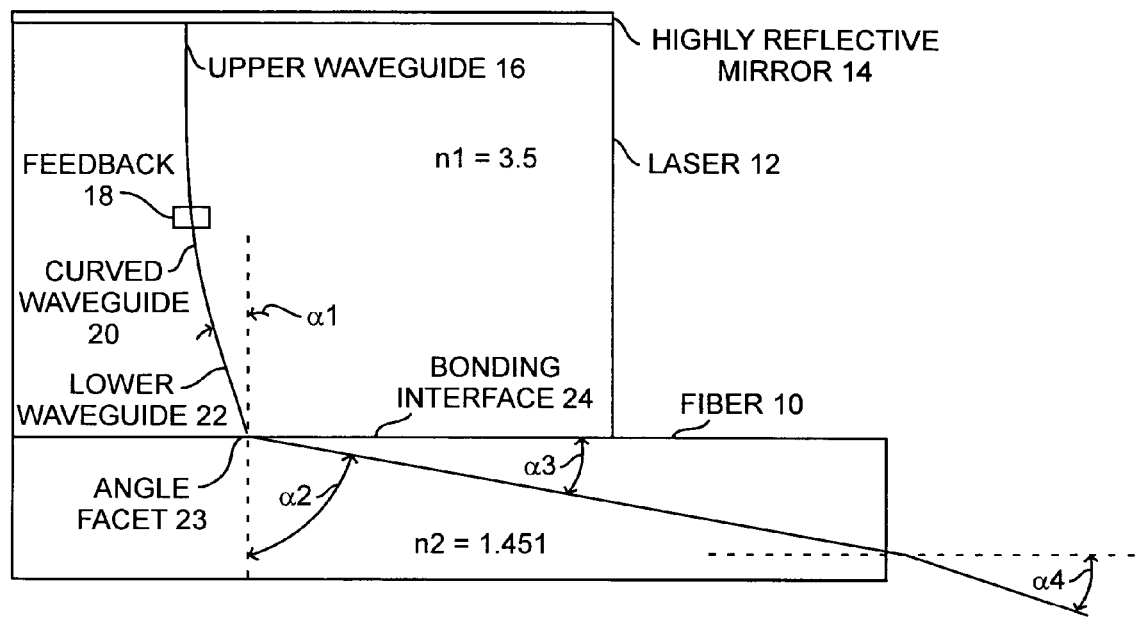
FIG. 1 is a diagram of a laser side-pumping an optical fiber.

An embodiment of the invention is described with reference to the figures using reference designations as shown in the figures. Referring to FIG. 1, a fiber 10 and a laser 12 are abutted together for side-pumping of laser light from the laser to and into the fiber. The laser 12 may be a semiconductor chip conventionally having a highly reflective mirror 14, an upper waveguide 16, and a feedback 18. While the laser shown has only one waveguide 16, parallel like waveguides 16 and feedback 18 could be used. Laser light exits the feedback 18 and enters a curved waveguide 20 for bending the light at a facet angle $\alpha 1$. The curve waveguide 20 ends at the edge of the laser 12. The curved waveguide 20 may include an ending lower waveguide 22 that is straight and includes a light exiting facet 23. The waveguide in total 18, 20, and 22 is an angled waveguide having a facet end 23 for directly coupling laser light into an optical fiber, such as an amplifier fiber, including Er/Yb doped silica amplifier fibers. The waveguide 20 and 22 in the laser 12 is angled for providing a facet angle $\alpha 1=24°$ to the surface normal of the laser facet surface at the exit of the laser waveguide 22. By angling the waveguide 22 at the exit facet 23 to 24° relative to the planar exit side of the laser 12, laser light can be side-pumped directly into the fiber 10. The angled laser light is directly transmitted into the inner cladding of the fiber 10, without passing through any intermediate region of refractive index below that of the amplifier fiber, such as through free space.

The pumping laser 10 can be fabricated with two reflectors 14 and 18 that are parallel to each other and orthogonal to the upper waveguide 16 of the laser diode. However, the feedback 18 reflects only part of the light to maintain lasing, the remaining power is passed out through the curved waveguide 20, lower waveguide 22, and exit facet 23 to form the useable side-pumping laser beam. This feedback 18 can be controlled by a strongly localized narrowing of the waveguide 20 or by a distributed Bragg grating inside the semiconductor laser 12. Beyond the feedback 18, the waveguide is curved so that the waveguide 18 changes direction to the facet angle. The refractive index n1 of the semiconductor laser 12 is on the order of 3.0 to 4.0, such as 3.5 for GaAs, a typical material for a 980 nm high-power diode laser. The refractive index n2 of the amplifier fiber 10 is on the order of 1.4 to 1.5, such as 1.451. The exiting laser beam from the laser 12 will be refracted by a refracting angle $\alpha 2$ that is between seventy degrees and ninety degrees when the angled facet 23 is brought into direct contact with the glass cladding of the amplifier fiber 10. After this side-pumping refraction, the propagating angle $\alpha 3=(90°-\alpha 2)$ of the propagating laser light will be entirely inside an acceptance cone of the fiber 10 for facilitating very low loss transmission. Laser light is continuously reflected and communicated down the fiber 10 when the propagation angle $\alpha 3$ is within a numerical aperture of the fiber 10 that corresponds to a maximum exit angle $\alpha 4$. The numerical aperture is equal to $(n)\sin \alpha 4$ where n is the index of refraction of air. The fiber 10 only needs to be locally stripped of the fiber polymeric cladding, not shown, and brought into contact with the angled laser facet 23. Any unintended submicron gaps between the laser waveguide facet 23 and the fiber polymeric cladding can be overcome by evanescent wave coupling to the fiber 10.

As a system, an optical amplifier is substantially simplified, as only the laser 12 and the fiber 10 are used. Very high coupling efficiencies are enabled along with low fabrication cost. One of the weakest spots in any laser, the output facet 23, is completely embedded into glass or shielded for substantially improving the laser reliability. The angles $\alpha 1$, $\alpha 2$, $\alpha 3$, and $\alpha 4$ and refractive indices n1 and n2 are used for determining the amount of refraction of the laser light according o Snell's law. The refractive index n1=3.5 is used as an example for a GaAs laser 12 at a wavelength of 980 nm, and refractive index n2=1.451 is used for fused silica of the fiber 10 operating at the same wavelength.

The amplifier fiber 10 is laid out for guided modes with a numerical aperture of 0.45. With such a numerical aperture, an output cone of the fiber has a half angle of $\alpha 4=\arcsin(0.45)=26.75°$. This half angle is equivalent to a cone angle for propagating modes inside the fiber at propagation angles of $\alpha 3 \leq 18.07°$. When the output from the laser 12 is not to undergo total internal reflection and yet enter into this cone, the beam has to be refracted to $\alpha 2=90°-\alpha 3$, where $\alpha 2$ is in the range of $71.93°<\alpha 2<90°$. As such, the angle of the waveguide with the output angle facet 23 of the laser 12 is $\alpha 1=\arcsin(n2/n1*\sin \alpha 2)=23.85°\pm 0.64°$. The very low angular tolerance transforms to a free space slow angle divergence of $\alpha_d \pm 2.3°$. The fast angle divergence $\alpha_d$ is reduced by the direct contact between the laser 12 and fiber 10. The angle divergence $\alpha_d$ combines with the propagation angle $\alpha 3$ of any ray to a total off axis angle $\alpha_{tot}$ in the fiber 10 with the cosine law of $\cos \alpha_{tot}=\cos \alpha 3 \cos \alpha_d$ to give only a marginal additional loss for rays that are extremely off axis through the fiber 10.

For optimum performance, the laser waveguide 22 is preferably designed longer than typical Fabry-Perot laser waveguides because the feedback will be small, so a long active region is best suited to provide an acceptably low threshold current density and high quantum efficiency. The facet 23 of the laser 10 may be coated with $SiO_2$ to facilitate a seamless transition from the laser 12 to the amplifier fiber 12. The seamless transition may increase the operational lifetime of the laser 12 because the facets exposed to air are the weakest point in a high power laser diode. When a grating is used for the feedback 18, the diode wavelength may be tailored accurately for optimum absorption by the rare earth atoms in the amplifier medium. At the high power levels, a low reflectivity grating of less than 1% may be used. Abrupt changes of the waveguide 20 may also be employed to obtain low feedback for avoiding the wavelength selectivity of a grating, and increasing the laser efficiency.

A bonding interface 24 is used for direct attachment of a laser chip 12 to an amplifying fiber 10. The bonding interface can be, for example, proximity coupling, epoxy bonding, plasma $SiO_2$ bonding, and bonding beads, among others. For proximity coupling, the fiber 10 and laser 12 are placed onto a common substrate without a bonding material between the laser 12 and fiber 10. When all coincidental gaps are kept smaller than one half the wavelength of the laser, which is typically, $(0.5)0.98 \mu m=0.49 \mu m$, evanescent coupling will provide efficient transfer of optical power into the fiber. To improve the efficiency of coupling, the fiber 10 can be locally polished to the flatness required. For epoxy bonding, the fiber 10 is placed in direct contact with the laser facet 23. An epoxy, such as, Norland 61 UV transparent adhesive is filled into the interface to establish a continuous optical path with a refractive index close to that of glass between the laser facet 23 and the fiber 10. The epoxy is cured and stays in place to bond the laser 12 to the fiber 10. For plasma $SiO_2$ bonding and after cleaving, the laser facet 23 is coated with a submicrometer coating of $SiO_2$. The fiber 10 and laser facet 23 are brought together as close as mechanically possible. Any remaining gaps are then filled by vacuum deposition of more SiO$_2$ that can be deposited by way of sputtering or plasma deposition for completely bridging the gap between the laser 12 and fiber 10 without the use of organic materials. Plasma SiO$_2$ bonding is preferred for coupling because there are no organic materials in the optical path for providing a reliable interface. The SiO$_2$ protects the laser facet 23 that is known to be the most frequent location of laser failures in common high power laser systems.

Figure 2:
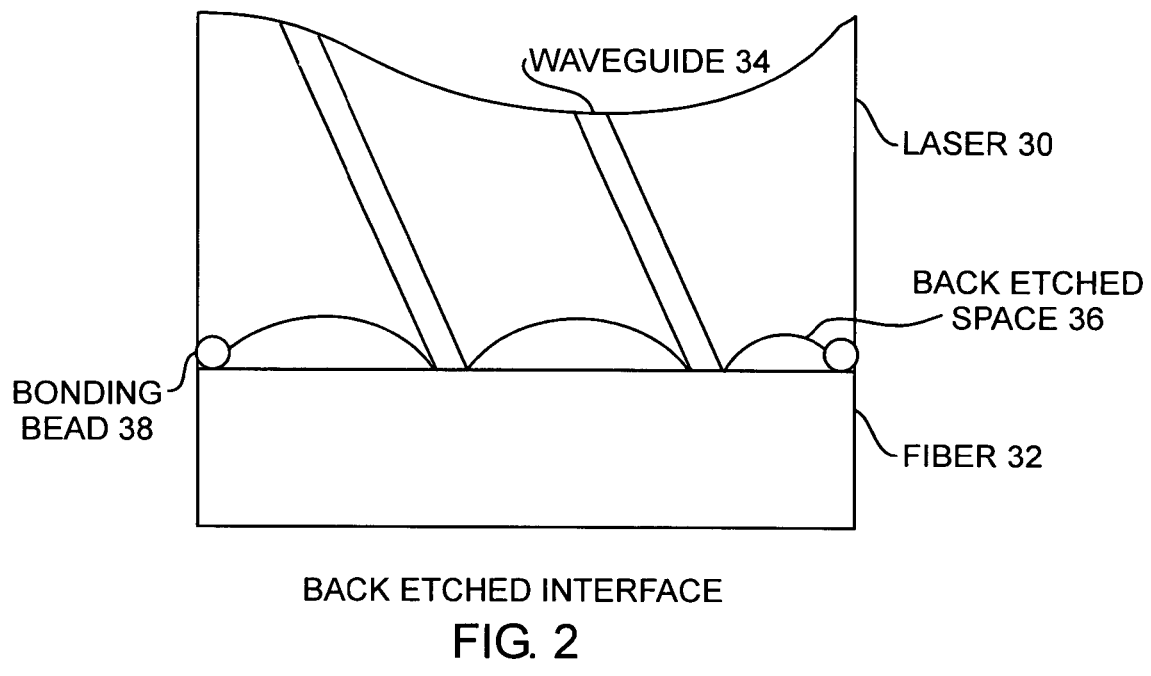
FIG. 2 is a diagram of an etched back laser side-pumping an optical fiber.

Referring to FIG. 2, a back-etched interface may be used for bonding a laser 30 to the fiber 32. Some semiconductor waveguides 34 have a narrowing for laser feedback. The waveguides 34 extend in parallel and connect to outter cladding of the fiber 32. Only the waveguide facets touch the outter cladding to minimize photon backflow. The bonding is provided locally by suitable bonding methods. The facet angle 23 is again necessary for correct refraction of laser light into the fiber 32 so that all laser light is communicated through the fiber 32. The laser 30 is back etched to create back etched spaces 36 for enabling bead placement. As such, the parallel waveguides 34 side-pump the fiber 32 using bonding beads 38.

Referring to all of the Figures, a side-pumping optical fiber system has side-pumping lasers and a fiber. The laser light exits at a facet angle and is communicated into an abutting fiber. The respective indices of refraction refract the laser light for redirecting the laser light for communication into and through the fiber. Various fibers and lasers can be used. For example, a laser made of very thin alternating layers of InGaAs/GaAs/InGaP. The fiber can be any optical fiber, such as amplifier fibers, hexagonal fibers, and circular fibers.

The system is directed to the direct attachment of a laser to fiber for side-pumping of the fiber using indices of refraction to refract and redirect pumped laser light into and through the optical fiber. The curved waveguide laser chips are preferred, but straight slanted parallel waveguides could be used as well for providing a simplified side-pumped amplifier fiber system. The laser is preferably a high-power diode laser having an angled waveguide facet for pumping laser light into the inner fiber cladding of a dual-cladding amplifier fiber. The laser can have curved waveguides that end in a facet that is angled, such as, at 24° with respect to the abutting waveguide. The abutting angle enables light exiting the semiconductor waveguide to be refracted directly into an acceptance light cone of the fiber. The system allows for an unlimited number of pump lasers that can be used to pump the fiber. As such, light intensity along the fiber length can be tailored to achieve the best amplification while reducing undesirable noise from spontaneous emission. A continuous SiO$_2$ optical bond can be used to protect the laser output facet that is the most sensitive part of the diode laser while providing an optical path between the laser and fiber. Those skilled in the art can make enhancements, improvements, and modifications to the invention, and these enhancements, improvements, and modifications may nonetheless fall within the spirit and scope of the following claims.

What is claimed is:

1. A system for side-pumping a fiber with laser light, the system comprising, a laser for emitting laser light at a laser angle at a laser facet, the laser characterized by a laser index of refraction, a fiber for trapping and communicating the laser light longitudinally through the fiber, the fiber characterized by a fiber index of refraction, and an interface between the laser facet and the fiber for redirecting laser light by refraction from the laser facet directly into a guidance cone of the fiber, the refraction produced by the laser angle and the difference between the laser index of refraction and the fiber index of refraction, the interface is a means for abutting directly together the laser to the fiber.

2. The system of claim 1 wherein,
the laser comprises a plurality of parallel waveguides with respective laser facets for emitting the laser light at the laser angle.

3. The system of claim 1 wherein,
the laser comprises a plurality of parallel waveguides with respective laser facets for emitting the laser light at the laser angle, the laser being back etched to expose the laser facets for abutting the laser facets to the fiber.

4. The system of claim 1 wherein,
the laser comprises a plurality of parallel waveguides with respective laser facets for emitting the laser light at the laser angle, the laser being back etched to expose the laser facets for abutting the laser facets to the fiber, and
the interface comprises bonding beads for bonding the laser to the fiber and for abutting laser facets to the fiber.

5. The system of claim 1 wherein,
the interface is a transparent adhesive.

6. The system of claim 1 wherein,
the interface is a film of SiO$_2$.

7. The system of claim 1 wherein,
the laser is any semiconductor diode laser operating at a wavelength of 980 nm.

8. The system of claim 1 wherein,
the laser is any semiconductor diode laser operating at a wavelength of 1480 nm.

9. The system of claim 1 wherein,
the laser is selected from a semiconductor diode laser group made of AlGaAs, InGaAs, GaAs, InGaP, InP or combinations thereof.

10. The system of claim 1 wherein,
the fiber is an Er/Yb doped silica amplifier fiber.

11. The system of claim 1 wherein,
the laser waveguide has an effective index of refraction of greater than two, and
the fiber has an index of refraction of less than two.

12. The system of claim 1 wherein,
the laser waveguide has an effective index of refraction n1 that is greater than two,
the fiber has an index of refraction n2 that is less than two, and
the laser waveguide has a laser angle $\alpha 1$ at a laser facet,
the laser light is redirected into the fiber at a refracting angle $\alpha 2$,
the laser light is propagated through the fiber at a propagation angle $\alpha 3$ where $\alpha 3 = (90° - \alpha 2)$, and
the refracting angle $\alpha 2 = \arcsin[n1/n2 * \sin(\alpha 1)]$.

13. The system of claim 1 wherein,
the laser waveguide has an effective index of refraction n1 that is greater than two,
the fiber has an index of refraction n2 that is less than two, and
the laser waveguide has a laser angle $\alpha 1$ at a laser facet,
the laser light is redirected into the fiber at a refracting angle $\alpha 2$, the laser light is propagated through the fiber at a propagation angle $\alpha 3$ where $\alpha 3 = (90° - \alpha 2)$, the refracting angle $\alpha 2 = \arcsin[n1/n2 * \sin(\alpha 1)]$, the fiber has a numerical aperture that is equal to $(n)\sin \alpha 4$ where n is the refractive index of air, and the laser light will propagate through the fiber without exiting when $(n2)\sin \alpha 3$ less than $(n)\sin \alpha 4$ but greater than 0.

* * * * *